United States Patent
Konishi et al.

[11] Patent Number: 5,512,541
[45] Date of Patent: Apr. 30, 1996

[54] METHOD OF PRODUCING AN OXIDE SUPERCONDUCTOR SINGLE CRYSTAL FILM

[75] Inventors: Masaya Konishi; Kunihiko Hayashi; Youichi Enomoto; Shoji Tanaka; Yasuji Yamada; Kanshi Ohtsu; Yasuo Kanamori; Yuh Shiohara, all of Tokyo, Japan

[73] Assignees: Sumitomo Electric Industries, Ltd., Osaka; International Superconductivity Technology Center, Tokyo, both of Japan

[21] Appl. No.: 304,770

[22] Filed: Sep. 12, 1994

[30] Foreign Application Priority Data

Sep. 13, 1993 [JP] Japan .................................. 5-252200

[51] Int. Cl.[6] ........................... H01L 39/24; C30B 23/00
[52] U.S. Cl. ....................... 505/474; 505/473; 505/234; 505/239; 505/729; 427/62; 427/596; 117/108; 117/904
[58] Field of Search .................................. 505/474, 473, 505/234, 239, 729; 427/62, 63, 596; 117/108, 904

[56] References Cited

U.S. PATENT DOCUMENTS 5,106,823  4/1992  Creuzet et al. ....................... 505/234
5,240,904  8/1993  Tanaka et al. ....................... 505/474

OTHER PUBLICATIONS

Lowndes et al, "In–Situ Growth of High Quality Epitaxial $YBa_2Cu_3O_{7-x}$ Thin Films at Moderate Temperatures by Pulsed Laser Ablation", MRS (Boston, MA) Nov. 27–Dec. 1989, pp. 1–4.

"Introduction of high temperature superconductor", published by Ohm corporation, Japan, Feb. 1989, pp. 75–99.

Shimazawa et al., Japanese Journal of Applied Physics, vol. 27, No. 6, Jun., 1988, pp. L1071–L1073.

*Primary Examiner*—Roy V. King
*Attorney, Agent, or Firm*—Cushman Darby & Cushman

[57] ABSTRACT

The present invention is directed to a method for growing a superconductive film on a superconductive substrate in order to produce a bulk single crystal. According to a preferred embodiment, an oxide superconductive film of a material which is the same or similar to the substrate material is epitaxially grown at a temperature between 450° C. and 800° C. so that the film and substrate have the same lattice orientations. According to the present invention, problems associated with conventional films having non-superconductor substrates (e.g., MgO and $SrTiO_3$) are avoided.

10 Claims, 8 Drawing Sheets

XRD (X-RAY DIFFRACTION) OF A YBCO FILM GROWN ON A (001) YBCO SUBSTRATE

XRD (X-RAY DIFFRACTION) OF A YBCO FILM GROWN ON A (100) YBCO SUBSTRATE

TEMPERATURE DEPENDENCE OF RESISTANCE OF A YBCO FILM GROWN ON A (001) YBCO SUBSTRATE

TEMPERATURE DEPENDENCE OF RESISTANCE OF A YBCO FILM GROWN ON A (100) YBCO SUBSTRATE

PULSE LASER DEPOSITON METHOD

SrTiO₃ (Perovskite structure)

ORTHORHOMBIC $YBa_2Cu_3O_{7-x}$ STRUCTURE

METHOD OF PRODUCING AN OXIDE SUPERCONDUCTOR SINGLE CRYSTAL FILM

FIELD OF THE INVENTION

This application claims the priority of Japanese Patent Application No.252200/1993 filed Sep. 13, 1993, which is incorporated herein by reference.

This invention relates to a method of producing an oxide superconductor single crystal film. In particular, this invention is directed to the formation of an oxide superconductor film of a desired orientation by controlling the crystallographical orientation of the film.

BACKGROUND OF THE INVENTION

Oxide superconductors have low carrier density. Namely the densities of carriers, i.e. electrons or holes which contribute to electric conduction, are inherently lower in oxide superconductors than in metal superconductors. All oxide superconductive films which have been reported hereto now were polycrystals. A polycrystal is an assembly of small single crystal granules with grain boundaries between neighboring granules. The grain boundaries have lattice defects. If the defects of the grain boundaries produce potential barriers, the barriers impair the electric conduction to a great extent. Thus polycrystal oxide superconductors have been useless for practical purposes as a material for producing electronic devices.

Therefore single crystals of oxide superconductive materials are indispensable for exploiting oxide superconductive materials for electrical use. Intensive research has been done for growing single crystal oxide superconductor films. However, no practical technology has matured for growing an oxide superconductor single crystal film of high quality. Furthermore, no big oxide superconductive bulk single crystal of good quality has been grown yet. Thus there has been no probability of the homoepitaxial growth of an oxide superconductive film upon an oxide superconductive single crystal substrate. In general, homoepitaxy is the best way for fabricating a high quality single crystal film of any material. However, homoepitaxy has been inapplicable to oxide superconductor material because of the lack of success in growing a big bulk single crystal.

Researchers have not succeeded yet in finding an acceptable substrate which enables an oxide superconductor to form a single crystal film of arbitrary orientation. Thus they produce substrates of oxide single crystals, for example, MgO or $SrTiO_3$ and grow an oxide superconductor film upon the MgO or $SrTiO_3$ single crystal substrate by heteroepitaxy. This is the present state of affairs for the fabrication of oxide superconductor films.

Cuprate superconductors are favored because they possess a high critical temperature Tc. The critical temperature means the transition temperature at which the state of the crystal changes from a superconductive condition to a normal conductive condition and vice versa. The material is superconductive below Tc but normal conductive above Tc. The cuprate superconductor has a layered crystal structure without cubic symmetry.

The lack of cubic symmetry differentiates the atomic arrangement in the planes parallel with the layers from the atomic arrangement in the direction normal to the layers. Anisotropy accompanies the structure of the layered arrangement of various atoms in the cuprate superconductor materials. The layered lattice structure promotes a strong anisotropy of the electric property in the cuprate superconductors. The controlling of the crystallographical direction (orientation) in growing the films is a basically important technology for allotting the desired electric property to the film crystal, especially when superconductive devices are produced on the grown single crystal films.

A junction is a fundamental element in the fabrication of electronic devices from superconductive materials. Junctions are made from multilayer film in many cases. Film crystals are important for the fabrication of junctions. In the case of superconductors, a superconductive coherent length is one of the most important parameters of the junction. The properties of superconductivity are greatly sensitive to the fluctuation of a crystallographical structure or the fluctuation of components in the oxide superconductors. If the interface of the junction has defects, the defects cause a degenerate layer to form. In this case, a short coherent length impedes the generation of a good junction property.

As explained before, the present crystal growth technology involves the heteroepitaxy of the oxide superconductive film on a single crystal MgO substrate or a single crystal $SrTiO_3$ substrate which can be easily grown by the current technology. Nevertheless, these commonplace bulk crystals have a lattice structure different from the layered structure of the oxide superconductor (orthorhombic symmetry). The crystals (MgO or $SrTiO_3$) for substrates have a cubic symmetry. Thus there is no crystallographical difference between c-axis and a-axis (a-axis also represents b-axis, because the a-axis and b-axis are equivalent or nearly equivalent axes). All a-, b- and c-axes are equivalent on crystallography in MgO and $SrTiO_3$ crystals.

The lattice structure is explained first. FIG. 8 is an exploded perspective representation of the unit lattice structure of an MgO crystal. An Mg atom has six nearest neighbor oxygen atoms in six directions perpendicular with each other. An oxygen atom has also six nearest neighbor Mg atoms in six perpendicular directions. However, there is no difference between a-axis, b-axis and c-axis. This is a very simple cubic crystal lattice. No anisotropy occurs between a-axis (including b-axis) and c-axis. MgO has a cubic lattice structure.

FIG. 9 is an exploded perspective representation of the unit lattice structure of $SrTiO_3$. Each of the six square planes has an oxygen atom at the center. Sr atoms occupy eight corners of the lattice. A Ti atom lies at the center of the lattice. The lattice is entirely symmetric in three directions. A-axis, b-axis and c-axis are equivalent. The lattice has no anisotropy. This is also a cubic lattice structure.

FIG. 10 is an exploded perspective representation of the unit lattice structure of $YBa_2Cu_3O_{7-x}$ (abbreviated YBCO). The lattice has a square pillar (orthorhombic) structure. Two Ba atoms vertically align at the center line. A Y atom interposes between the two Ba atoms. O atoms are arranged along the side rectangular planes of the pillar. Four sets of four Cu atoms are aligned along the four vertical lines of the lattice pillar. The lattice has three layers in the vertical direction. A single layer has four Cu atoms. A Cu atom has four O atoms as the nearest neighbor at every 90 degrees around on some layer. Blank rounds and dotted rounds mean O atoms in the figure. The lattice structure is nearly equivalent in a-axis and b-axis. But the arrangement of atoms in c-axis is totally different from the arrangement in a-axis or b-axis. C-axis is longer than a-axis or b-axis. C-axis is unequivalent to a-axis or b-axis. There is a strong anisotropy between a-axis and c-axis in YBCO.

When a cuprate superconductor (e.g. YBCO) film is grown on a MgO substrate or a cubic perovskite substrate (e.g. SrTiO$_3$), the film and the substrate have different lattice structures. The substrate is isotropic in all three directions. But the film has anisotropy with regard to c-axis. The film has different properties along c-axis from the properties in a-axis or b-axis direction.

Homoepitaxy can determine the crystal orientation of a film uniquely by the crystal orientation of the substrate. The orientation of the film is the same as the orientation of the substrate.

Unlike homoepitaxy, heteroepitaxy cannot determine the orientation of the crystal structure of the film by the orientation of the substrate because of the difference in the lattice structures. Now two different films are defined for the growing superconductive films. "A-axis orientated film" is a film whose normal is parallel with a-axis. Namely the surface of the film is parallel both with c-axis and with b-axis. "C-axis orientated film" has a normal parallel with c-axis.

Because of anisotropy, a-axis orientated films may be expected to be produced with the same probability as c-axis oriented films, when cuprate superconductor films are heteroepitaxially grown on the cubic single crystal substrates, e.g. MgO or SrTiO$_3$. But this does not in fact hold true. The temperature of the substrate determines whether the seed crystal yields a c-axis oriented film or an a-axis oriented film. Present heteroepitaxy only makes either a-axis oriented films with many defects or c-axis oriented films of oxide superconductors on the commonplace cubic crystals.

An oxide superconductor has another anisotropy besides the lattice anisotropy explained above. This is the anisotropy of growing speed. The growing velocity is faster in a-axis and b-axis than in c-axis. In general, the axes which are flavored with the fastest growing velocity are likely to become parallel with the surface of the growing film. Since a-axis and b-axis have faster speed of growth, the surface of a growing film tends to include both a-axis and b-axis. Thus films are apt to become c-axis oriented films. Therefore the orientation of a growing film is determined not by the lattice orientation of a substrate but by the structural anisotropy of the oxide superconductor itself in the heteroepitaxy of oxide superconductive materials.

For example, the heteroepitaxy on a cubic perovskite substrate is likely to produce a film which has a normal parallel with c-axis. C-axis oriented films are mainly produced by the heteroepitaxy on a cubic perovskite substrate (e.g. SrTiO$_3$). If a plurality of c-axis oriented films are deposited on a substrate, the junctions between the neighboring films are normal to c-axis. Such a junction whose normal is parallel with c-axis is called a "c-axis junction".

If the coherent length along c-axis is short, a current flows across the c-axis junction with difficulty. The short coherent length deteriorates the property of the junction.

$\xi$ denotes the coherent length which denotes the extension of a Cooper pair. The coherent length is defined with regard to a certain direction. $\xi_a$ is the coherent length along a-axis. $\xi_o$ is the coherent length in the direction of c-axis. YBCO has an a-axis coherent length $\xi_a$ far longer than a c-axis coherent length $\xi_o$. Namely $\xi_a \gg \xi_o$.

If a coherent length in a certain direction is long, a large current can flow through a junction which is perpendicular to the direction. Since the direction of a-axis (or b-axis) has a long coherent length, an a-axis junction (which is perpendicular to a-axis) enables a large current to flow across the junction. Therefore the a-axis oriented film is far superior in the current flow to the c-axis oriented film. A new technology has been ardently expected for fabricating a-axis oriented films with which c-axis is parallel. The a-axis oriented film is defined as a film whose normal is parallel with a-axis. If an a-axis oriented film were produced, an a-axis junction would be obtained. The a-axis junction would exhibit excellent joint properties, since a-coherent length $\xi_a$ is long enough in comparison with c-coherent length $\xi_o$. Nevertheless, nobody has succeeded in making an a-axis oriented film of good quality. All the a-axis oriented films which have been produced have a plenty of defects. The defects impede the current flow in the a-axis direction. The production of high quality a-axis films remains still a dream of researchers.

FIG. 1 is a graph showing the relation between the substrate temperature (° C.) and the transition temperature Tc (K) when YBCO (YBa$_2$Cu$_3$O$_{7-x}$) films are grown on SrTiO$_3$ single crystal substrates described in Hidchumi Asano's thesis for a doctor's degree, "Research on the control of orientations of crystal growth of high temperature oxide superconductor films and the properties of same", p88 (1992). The abscissa denotes the temperature (° C.) of the substrates. The ordinate is the transition temperatures Tc (K: Kelvin). The growths were done at two different oxygen partial pressures of 3.8 mTorr and 0.76 mTorr. Rounds designate the results at a 0.76 mTorr oxygen partial pressure. Squares denote the data at an oxygen partial pressure of 3.8 mTorr. An increase of the transition temperature Tc accompanies the rise of the substrate temperature between 480° C. and 600° C. In the same range, the transition temperature depends upon the partial pressure of oxygen of the atmosphere in the chamber. Blank rounds or blank squares denote the growth of a-axis oriented films. Black rounds or black squares denote the formation of c-axis oriented films. What is important is the fact that low temperature growth between 400° C. and 580° C. enables the SrTiO$_3$ substrate to yield a-axis orientated films as shown by the assemblies of blank rounds and blank squares. Higher substrate temperature between 600° C. and 680° C. is likely to let the SrTiO$_3$ substrate make c-axis oriented films. Mixtures of a-axis oriented parts and c-axis oriented parts are produced in the intermediate range between 580° C. and 600° C. The mixture films are denoted by dotted rounds or dotted squares.

Therefore the heteroepitaxy of a YBCO film on a SrTiO$_3$ monocrystal substrate selectively produces either an a-axis oriented film or a c-axis oriented film by controlling the temperature of the substrate. The property by which the film orientation is determined by the temperature is hereinafter referred to as a temperature preference of orientation. The substrate has no crystallographical anisotropy between a-axis and c-axis, because it is a cubic crystal. But the YBCO crystal itself has a power of selecting orientations of growth. An a-axis oriented film can be made on the SrTiO$_3$ crystal by the low temperature growth from 400° C. to 580° C. Then one may imagine an a-axis junction can be produced by piling a plurality of a-axis oriented films on a SrTiO$_3$ substrate at the low temperature. However, this does not hold true. The low temperature grown films have plenty of defects. The defects hinder a big current from flowing in the a-axis oriented crystal in the superconductive state. Defective a-axis oriented films are useless, because the defects restrict the current despite the long coherent length in the normal direction. A-axis oriented films without defects are desired at present. One purpose of the invention is to provide a method of producing defect-free a-axis oriented films of oxide superconducting materials. Another purpose of the invention is to provide a method of making a-axis oriented films at high temperature. Another purpose of the invention is to provide a method of fabricating a junction which enables a large current to flow across the boundary.

SUMMARY OF THE INVENTION

This invention provides an oxide superconductor single crystal including a rare earth element, an alkali earth metal and a copper type metal as a seed substrate and grows an oxide superconductor single crystal film having the same lattice structure as the substrate or the lattice structure similar to the substrate except a replacement of some atoms. According to the present invention, homoepitaxy is preferred rather than heteroepitaxy for producing high quality films of oxide superconductive materials. The essence of this invention is the epitaxy of an oxide superconductive film on an oxide superconductive substrate. Accordingly, this invention excludes MgO and $SrTiO_3$ etc. substrates upon which the conventional technique has relied due to the easy fabrication of single crystal as the substrate material.

Until recently, suitable methods for growing a large bulk oxide superconductor crystal and a large bulk crystal of oxide superconductor were unknown. However, the Inventors have just recently succeeded in growing a bulk single crystal of oxide superconductor e.g. YBCO having high transition temperature Tc by our intensive research. The new technology can grow a large YBCO single crystal of a surface of 5 mm×5 mm now. The advent of the technology is epoch-making by itself. The birth of the substrate making technology further enables the Inventors to establish an incidental technology of depositing an oxide superconductive film on the oxide superconductive substrate which has been made by the new substrate making technology. The Inventors have tried homoepitaxially growing oxide superconductive films on the oxide superconductive substrates and have found the films are grown just in the same crystallographical orientation as the substrate single crystal.

Namely the substrate orientation dictates the orientation of the films growing on the substrate in a similar manner to the conventional homoepitaxy of other materials. When the substrate has an a-plane surface (100), the film grown on the substrate becomes an a-axis oriented film. The property that the orientation of films is determined by the substrate orientation is hereinafter referred to as "a substrate preference of orientation". When the oxide superconductor crystal is used as a substrate in order to make an oxide superconductor film, the substrate preference of orientation is stronger than the temperature preference of orientation. In other words, the substrate orientation dominates the orientation of the film. The substrate preference of orientation holds good, even when the lattice structure of the film is not entirely the same as the lattice of the substrate, but is slightly different by some replacements of a few atoms from the lattice of the substrate. Thus this invention includes both homoepitaxy and heteroepitaxy as the means for growing films. The heteroepitaxy confines the mother crystal (substrate crystal) within oxide superconductors which will be obtained by replacing some atoms in the lattice of the film crystal.

The advantages of the invention are now explained. An oxide superconductor film is fabricated on an oxide superconductor single crystal substrate according to this invention. The orientation of the film is determined by the orientation of the substrate superconductor. An a-axis oriented film can be produced by a substrate of an a-plane surface. A c-plane substrate can make only a c-axis oriented film. The unique determination of the orientation of films by the substrate orientation holds good between a wide temperature range between 450° C. and 800° C. This invention enables an a-axis oriented film to grow at high temperature. High temperature growth improves the quality of the crystal by eliminating misalignments, dislocations or other defects. The coherent length is longer in a-axis than c-axis. This invention can produce high quality junctions by growing a-axis oriented films with a long coherent length at high temperature.

DETAILED DESCRIPTION OF THE INVENTION

Figure 2:
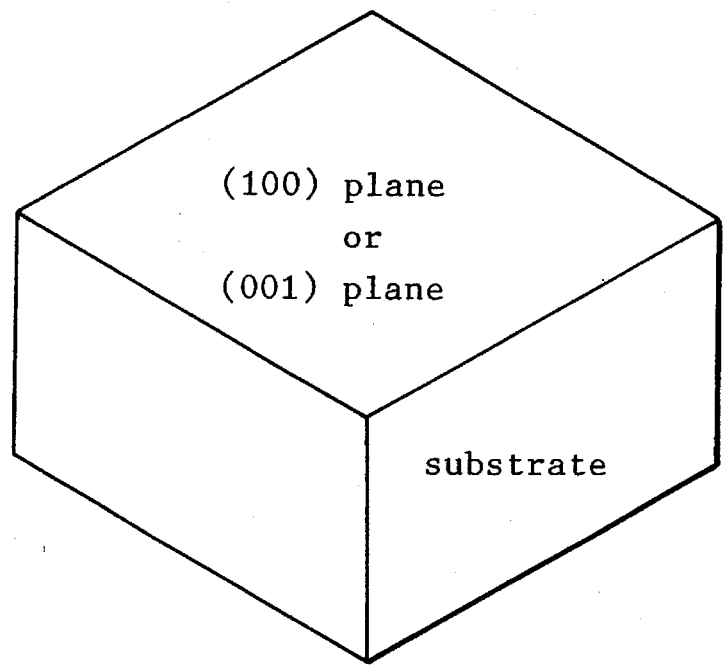
FIG. 2 is explanatory figures showing the growth of an oxide superconductor film on a (100) or (001) oxide superconductor substrate.
Figure 2:
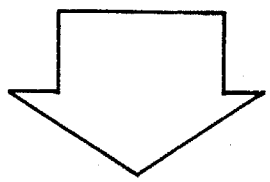
Figure 2:
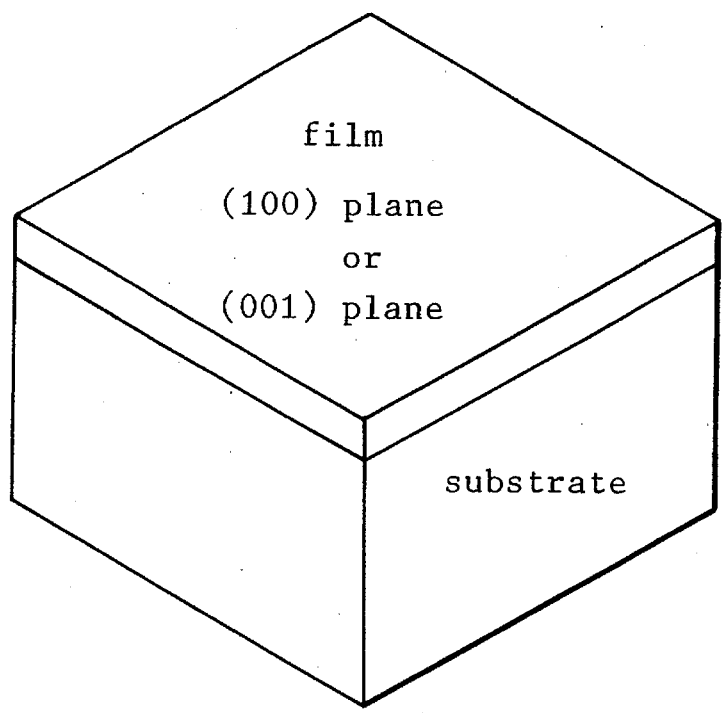

This invention is further clarified by the following non-limiting preferred embodiments. Although the embodiments relate mainly to the growth of YBCO ($YBa_2Cu_3O_{7-x}$), this invention is applicable to similar oxide superconductive materials which are obtained by replacing Y of YBCO by a rare earth metal, e.g. La, Er, Eu, Gd, Dy, Sm or Ho. Further this application can be applied to semiconductor materials which are obtained by replacing Y of YBCO by Pr or Sc. This invention holds good also to the materials $YBa_2(Cu_zM_{1-z})_3O_{7-x}$ which is obtained by replacing a part of Cu atoms by copper type metals M e.g. Ni, Co or Zn atoms, wherein M=Ni or Co and z is at least 0.90 and less than 1 or M=Zn and z is at least 0.95 and less than 1. This invention is further applicable to the materials $LR_2M_3O_{7-x}$ (L=Y, La, Er, Eu, Gd, Dy, Sm or Ho, R=Ba, Sr or Mg, and M=Cu, Ni, Co or Zn). As shown in FIG. 2, the substrate is a (100) or (001) YBCO single crystal. A YBCO bulk single crystal or a single crystal of a similar material is grown by the mentioned substrate making technology. The orientation of the single crystal is determined by the X-ray Laue method. Then the bulk crystal is cut into a shape of a plate. The plate is polished by diamond compounds. Then the plate is used as a substrate.

[EMBODIMENT 1] Growth upon c-plane ((001)-plane)

Figure 3:
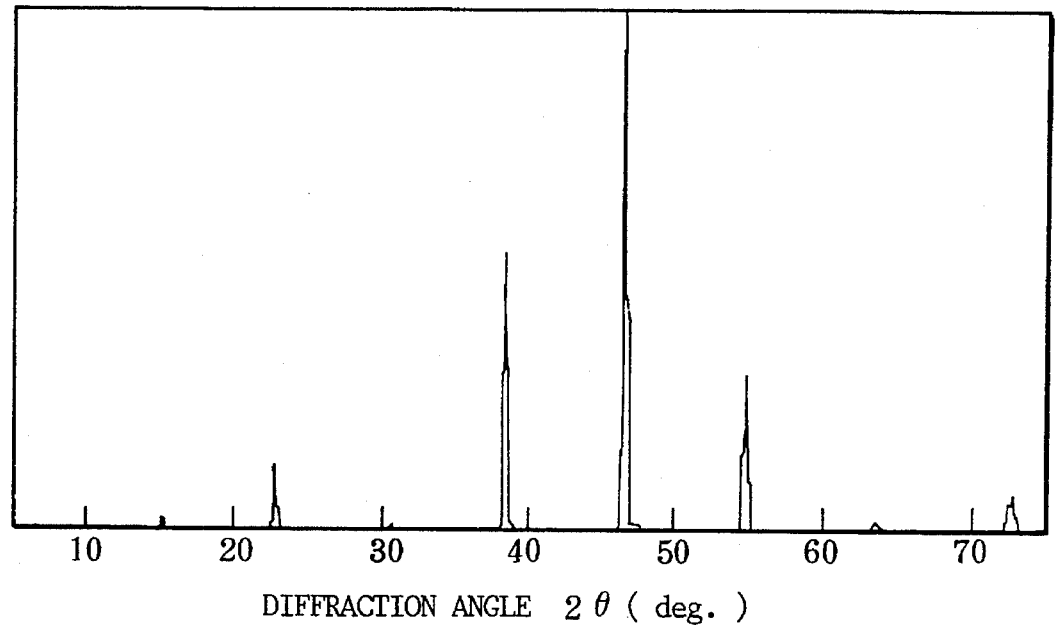
FIG. 3 is a graph showing the result of an X-ray diffraction measurement of a YBCO film grown on a (001) YBCO substrate.
Figure 4:
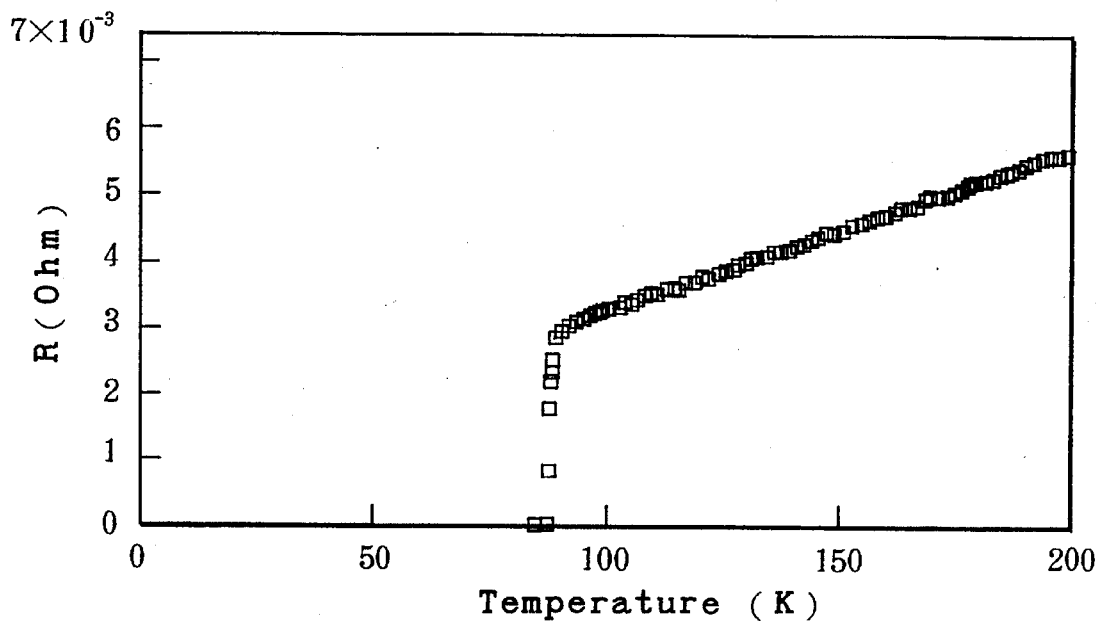
FIG. 4 is a graph showing the temperature dependence of electric resistance of a YBCO film grown on a (001) YBCO substrate.
Figure 7:
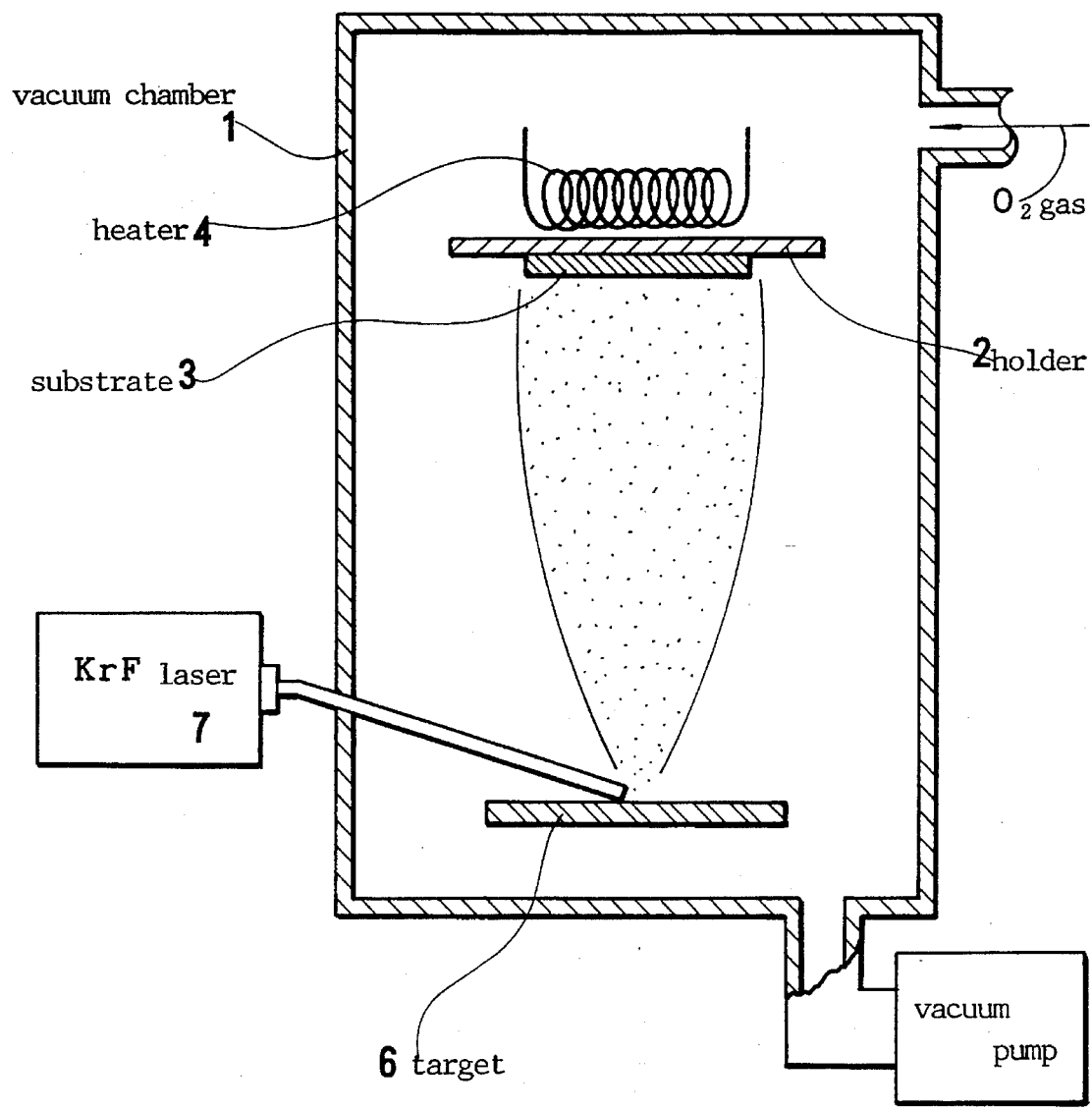
FIG. 7 is a schematic view of a pulse laser deposition apparatus.
Figure 8:
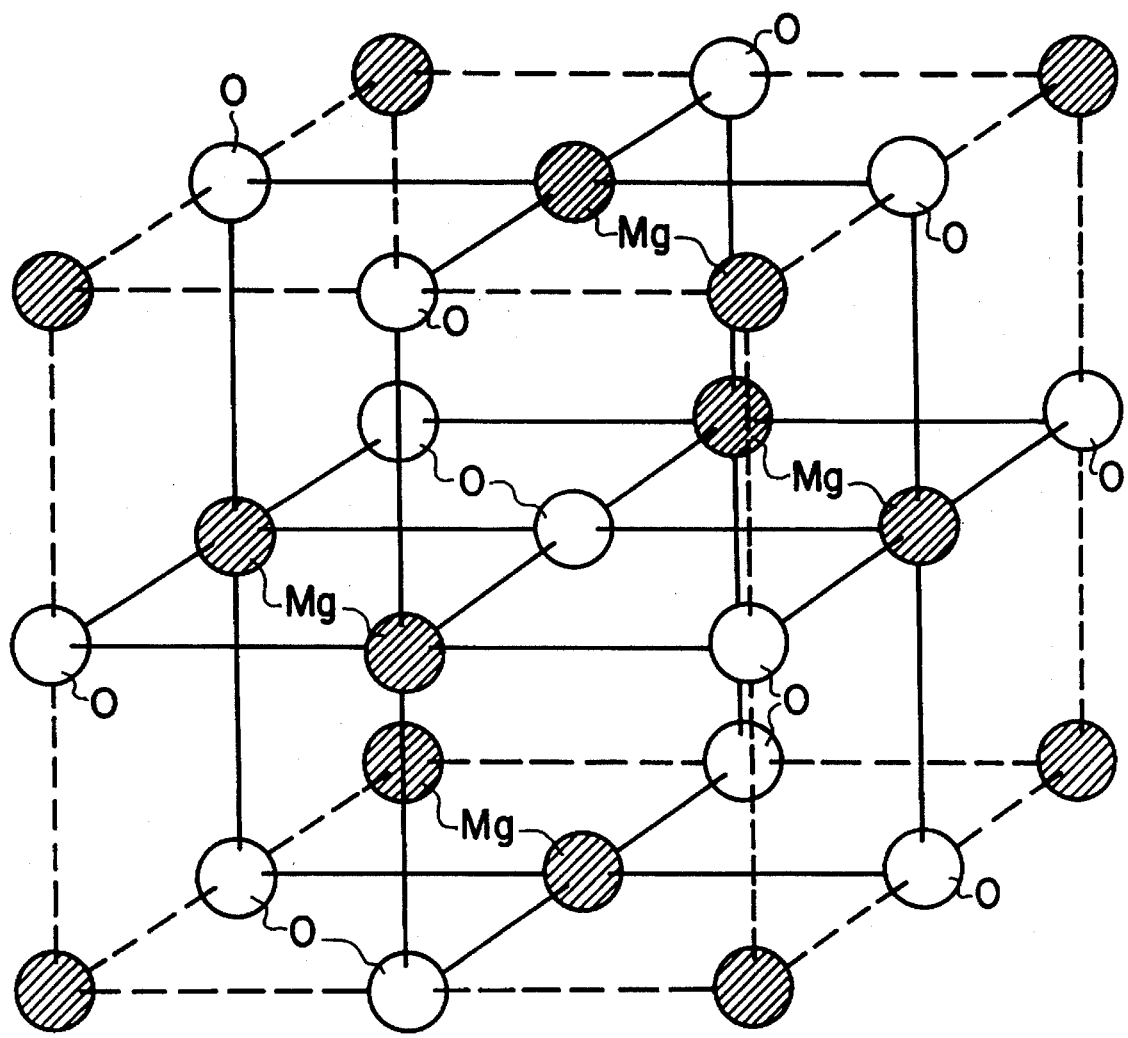
FIG. 8 is a perspective view of the lattice structure of MgO.
Figure 9:
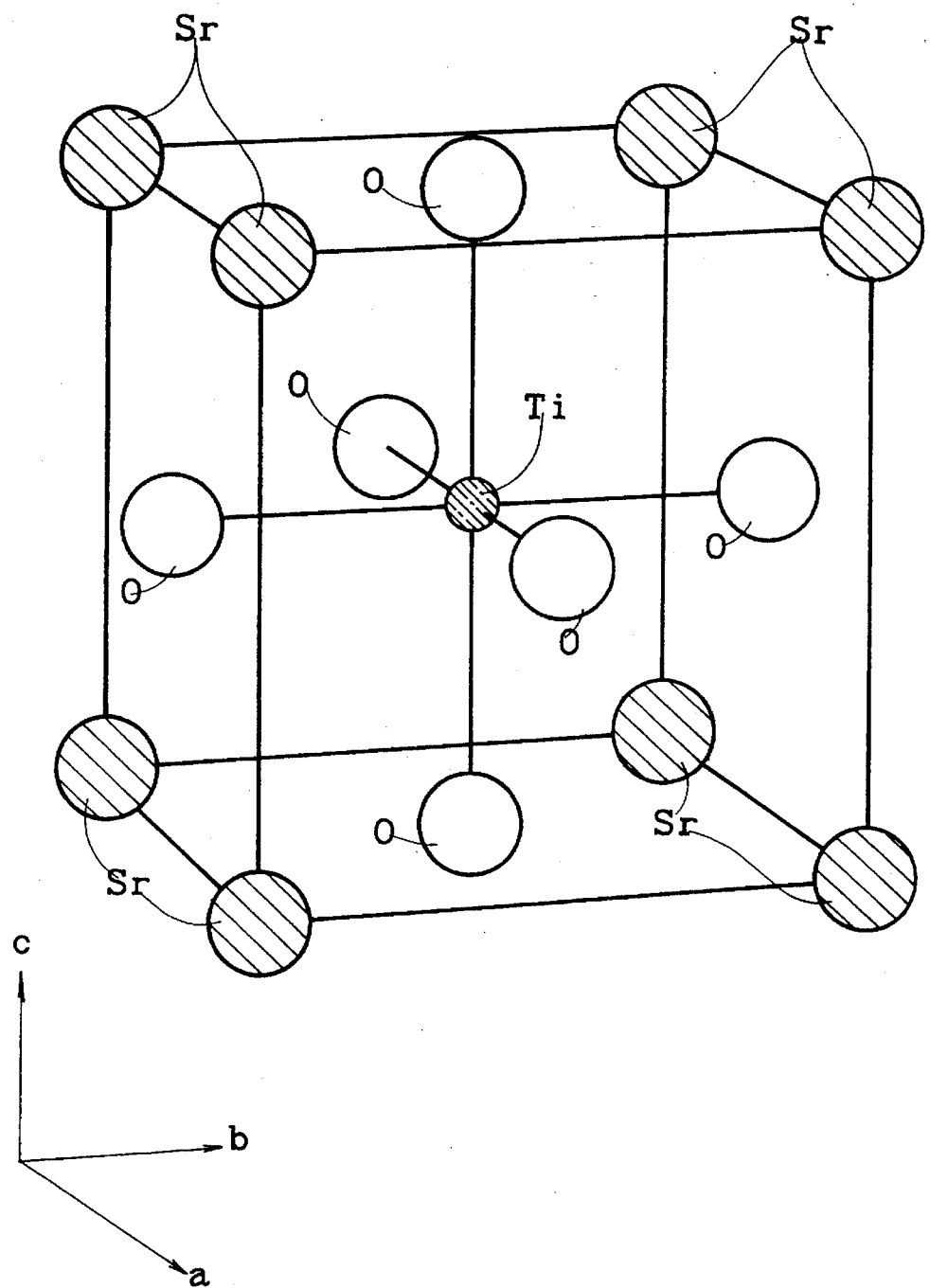
FIG. 9 is a perspective view of the lattice structure of $SrTiO_3$.
Figure 10:
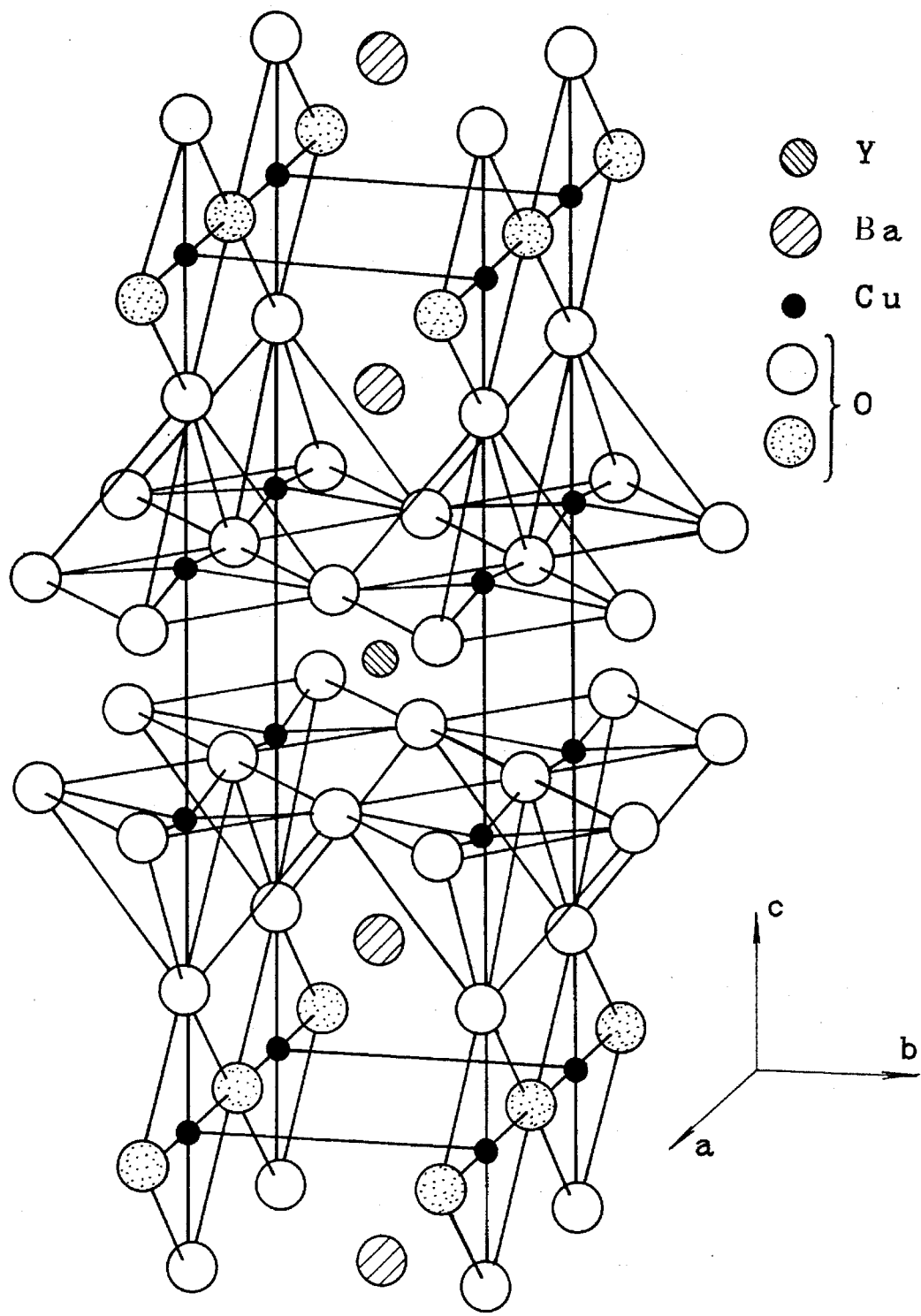
FIG. 10 is a perspective view of the lattice structure of YBCO ($YBa_2Cu_3O_{7-x}$).

A YBCO film is grown on a c-plane (001) of $YBa_2Cu_3O_{7-x}$ (YBCO) single crystal by the method of pulse laser deposition method using the apparatus shown in FIG. 7. A chamber (1) is a vessel which can be evacuated by a vacuum pump. A holder (2) is furnished a substrate (3) in an tipper space of the vacuum chamber (1). The holder (2) supports a single crystal substrate facing downward. A heater (4) heats the holder (2) and the substrate (3). A target (6) is laid in a lower space of the vacuum chamber (1). A KrF laser (7) installed out of the vacuum chamber (1) emits high power ultraviolet beams. The ultraviolet beams irradiate the target (6) and evaporate a part of the surface of the target (6). The vapor of the target material rises to the substrate (3) and adheres to the substrate. The vapor is solidified and deposited on the substrate. This is the function of the pulse laser deposition method. The YBCO film is grown by the apparatus of FIG. 7 under the conditions;

substrate: $YBa_2Cu_3O_{7-x}$ single crystal c-plane ((001)-plane)

target: $YBa_2Cu_3O_{7-x}$ polycrystal substrate temperature: 790° C.

partial pressure of oxygen: 100 mTorr growth time: 27 minutes thickness of the film: 300 nm KrF laser: energy density 5 J/cm$^2$ wavelength 248 nm FIG. 3 shows the result of the X-ray diffraction measurement. The abscissa is the diffraction angle 2θ. The ordinate is the diffraction intensity. The diffraction pattern has the strongest peak at 2θ=46°. Besides, 2θ=38° and 2θ=55° are the next highest peaks. The X-ray diffraction proves that this film is a single crystal with a (001) surface. The result shows that a (001) YBCO film is grown on a (001) YBCO substrate, The temperature dependence of resistivity of the film is measured in order to investigate whether this film becomes a superconductive state. FIG. 4 is the graph showing the change of resistance as a function of temperature. The abscissa is the temperature (K) of the film sample. The ordinate is the resistance (Ω) of the film. The resistance of the YBCO film is $5.5\times10^{-3}$ Ω at 200K, $4.3\times10^{-3}$ Ω at 150K and $3.3\times10^{-3}$ Ω at 100K. The resistance decreases linearly in proportion to the temperature between 200K and 88K. The resistance suddenly falls to 0 at 88K. This film makes a transition from the normal state to the superconductive state at 88K. Thus the film is a high temperature superconductor with a high transition temperature Tc(=88K.). The transition temperature is the same as Tc of the substrate superconductor. The transition temperature is common for both the bulk crystal and the film crystal.

[EMBODIMENT 2] Growth on a-plane ((100)-plane)

A YBCO film is grown on another YBCO ($YBa_2Cu_3O_{7-x}$) single crystal with a-plane (100) surface by the pulse laser deposition method of FIG. 7 under the conditions;

substrate $YBa_2Cu_3O_{7-x}$ single crystal a-plane ((100)-plane)

target: $YBa_2Cu_3O_{7-x}$ polycrystal substrate temperature: 790° C.

partial pressure of oxygen: 100 mTorr growth time: 27 minutes thickness of film: 300 nm KrF laser: energy density 5 J/cm$^2$ wavelength 248 nm.

Figure 5:
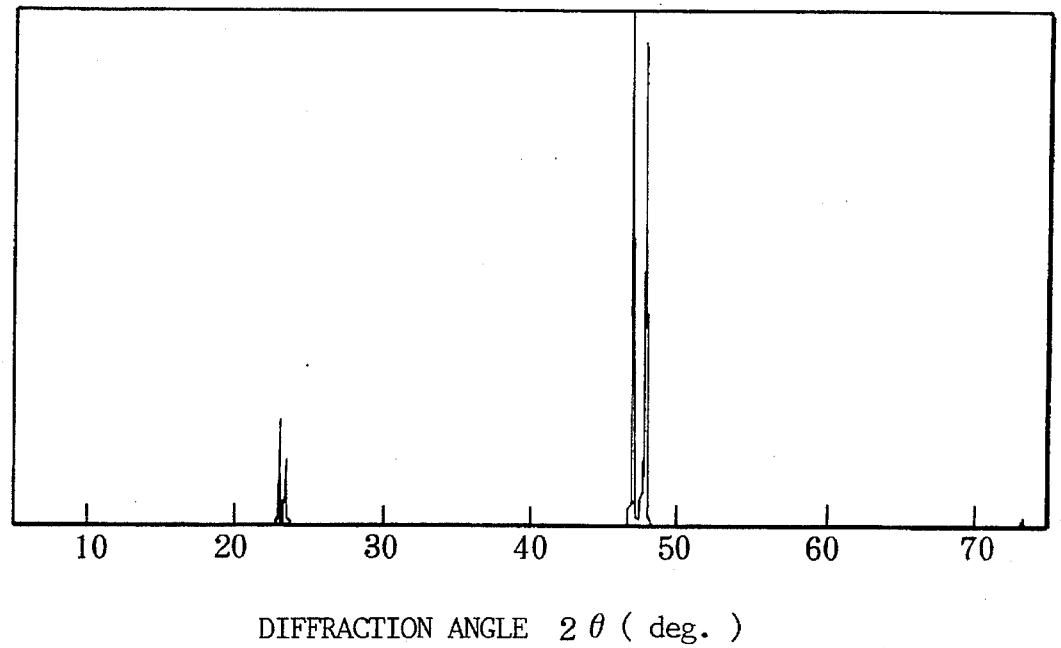
FIG. 5 is a graph showing the result of an X-ray diffraction measurement of a YBCO film grown on a (100) YBCO substrate.

FIG. 5 is the graph showing the result of the X-ray diffraction measurement. The abscissa is the diffraction angle 2θ. The ordinate is the diffraction intensity. Strong peaks appear at 2θ=47° and 2θ=48°. The peaks of 2θ=46°, 2θ=38° and 2θ=55° which existed in FIG. 3 do not appear. The X-ray diffraction teaches the film has the (100) orientation. The experiments clarify that a (100) YBCO substrate allows a (100) YBCO film to grow on it and a (001) YBCO substrate enables a (001) YBCO film to grow thereon. Thus the film transcribes the orientation of the substrate.

Figure 6:
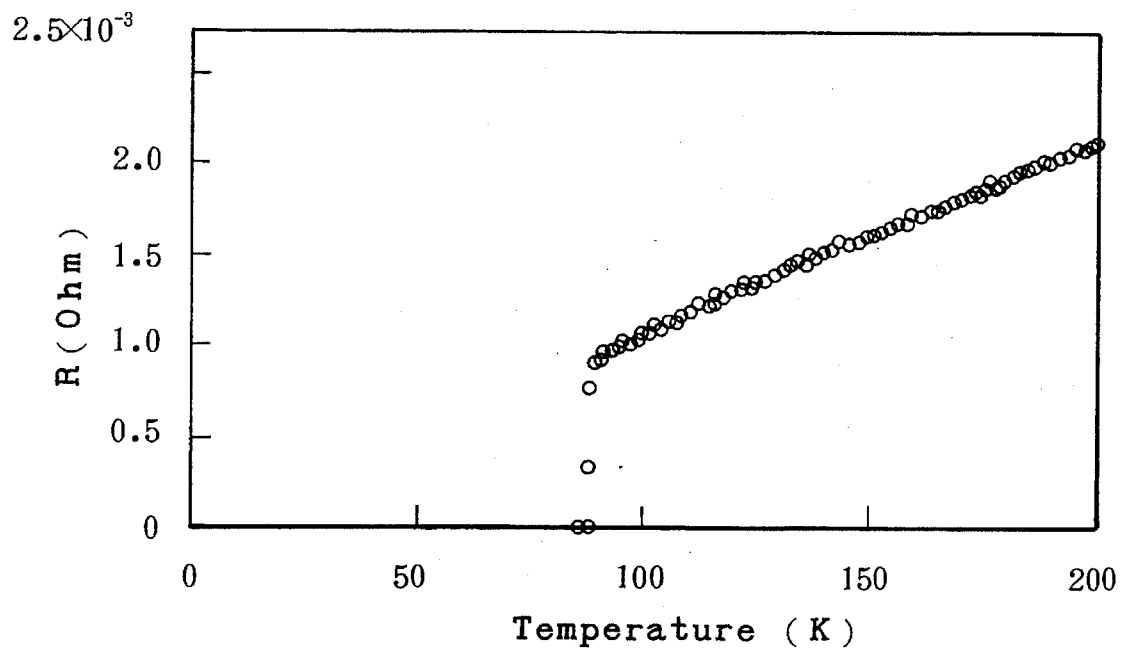
FIG. 6 is a graph exhibiting the temperature dependence of electric resistance of a YBCO film deposited upon a (100) YBCO substrate.

Then the resistance of the (100) YBCO film is measured at various temperatures in order to examine whether this film makes a transition to a superconductive state. FIG. 6 is the graph showing the result of the measurement. The abscissa is the temperature. The ordinate is the resistance of the film. The resistance of the film is $2.1\times10^{-3}$ Ω at 200K, $1.6\times10^{-3}$ Ω at 150K and $1.1\times10^{-3}$ Ω at 100K. The resistance linearly depends upon the temperature in the range. However, the resistance drops of a sudden at 88K. The resistance is 0 below 88K. The film becomes superconductive at 88K. The a-axis oriented film also makes a transition to a superconductor at 88K. Thus a-axis oriented film ((100) film) has the same transition temperature Tc as the bulk crystal. The temperature dependence of the resistance in the (100) film is similar to the (001) film between 88K and 200K.

The example is important. As explained before, no good a-axis oriented film can be produced by the heteroepitaxy grown on a MgO monocrystal substrate or a $SrTiO_3$ monocrystal substrate. Nevertheless, the example signifies that a (100) (a-axis oriented) YBCO film of high quality can be produced by the homoepitaxy (or heteroepitaxy) on a (100) YBCO single crystal (or on a similar single crystal) for the first time.

Figure 1:
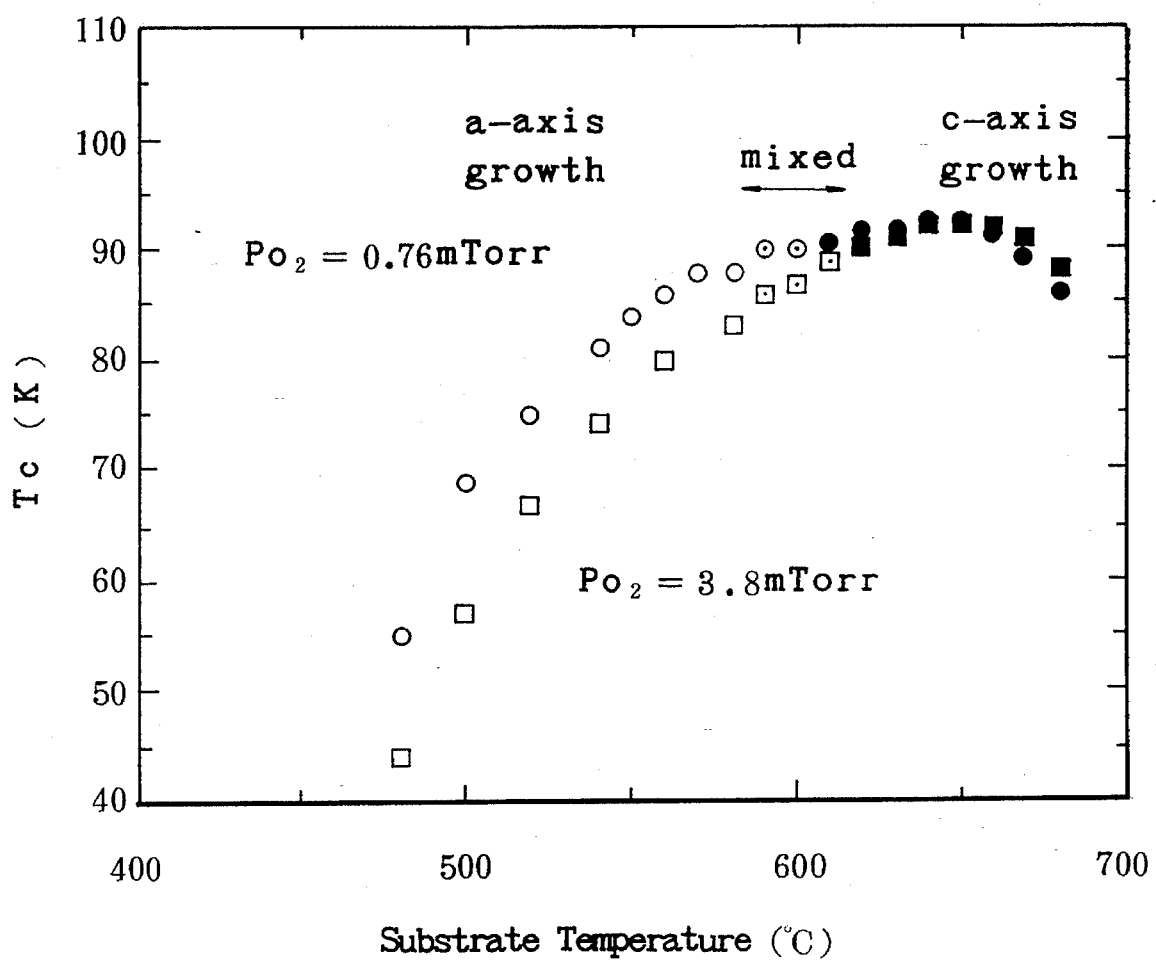
FIG. 1 is a graph showing the relation between the substrate temperature and the transition temperature of the superconductor film described in Hidehumi Asano's thesis for a doctor's degree, "Research on the control of orientations of crystal growth of high temperature oxide superconductive films and the properties of same", (Faculty of technology of Nagoya University, thesis for a doctor's degree by Hidehumi Asano p88 (1992)).

With regard to FIG. 1, low temperature (480° C.–580° C.) deposition is likely to make a defective a-axis oriented film and high temperature deposition (600° C.–700° C.) is apt to produce a c-axis oriented film in the case of the cubic $SrTiO_3$ substrate. Although the low temperature growth has a tendency of making an a-axis oriented film, the film is plagued with poor properties due to defects.

The embodiment employs the high temperature of substrate of 790° C. in epitaxy. The inherent nature of YBCO would be likely to make a c-axis oriented film at such high temperature. However, the embodiment produces an a-axis ((100)-plane) film owing to the orientation of the YBCO substrate. Namely the substrate preference of orientation overcomes the temperature preference of orientation. The discovery of the prominence of the substrate preference over the temperature preference is one of the important matters or this invention. The high temperature growth enhances the quality of the film crystal. The crystals produced at high temperature are immune from defects. This invention grows an a-axis orientated film at high temperature by an a-axis oriented substrate. A-axis oriented crystals have a longer coherent length than c-axis oriented crystals. This invention has succeeded in making a-axis oriented films without defects for the first time. The junctions made by piling the a-axis oriented films enjoy high current density due to the high quality of crystal structure and the long coherent length.

What we claim is:

1. A method of producing an oxide superconductor film comprising the steps of:

providing an oxide superconductor single crystal substrate consisting essentially of an oxide superconductor material with an orientation containing a rare earth metal, an alkali earth metal and a copper metal; and growing the oxide superconductor film homoepitaxially on the substrate in the same orientation as the substrate.

2. A method of producing an oxide superconductor film comprising the steps of:

providing an oxide superconductor single crystal substrate consisting essentially of an oxide superconductor material with an orientation containing a rare earth metal, an alkali earth metal and a copper metal; and growing the oxide superconductor film of a material having a lattice structure which will be reduced to the substrate lattice by replacing metal constituent atoms heteroepitaxially on the substrate in the same orientation as the substrate.

3. A method of producing an oxide superconductor film containing a rare earth metal, an alkali earth metal and a copper metal comprising the steps of:

providing an oxide superconductor single crystal substrate consisting essentially of an oxide superconductor material, the material being oriented and arranged to be reduced to the superconductor film by replacing metal constituent atoms; and growing an oxide superconductor single crystal film on the substrate in the same orientation as the substrate.

4. A method of producing an oxide superconductor film comprising the steps of:

providing an oxide superconductor $YBa_2Cu_3O_{7-x}$ single crystal substrate consisting essentially of an oxide superconductor material;

heating the substrate at a temperature between 450° C. and 800° C.; and growing an oxide superconductor $YBa_2Cu_3O_{7-x}$ film with the same orientation as the substrate by a pulse laser deposition method.

5. A method of producing an oxide superconductor film comprising the steps of:

providing an oxide superconductor $YBa_2Cu_3O_{7-x}$ single crystal substrate consisting essentially of an oxide superconductor material;

heating the substrate at a temperature between 450° C. and 800° C.; and growing an oxide superconductor $YBa_2(Cu_zM_{1-z})_3O_{7-x}$ film in the same orientation as the substrate by a pulse laser deposition method, wherein M=Ni and z is at least 0.90 and less than 1, or M=Co and z is at least 0.90 and less than 1, or M=Zn and z is at least 0.95 and less than 1.

6. A method of producing an oxide superconductor film comprising the steps of:

providing an oxide superconductor $YBa_2(Cu_zM_{1-z})_3O_{7-x}$ single crystal substrate consisting essentially of an oxide superconductor material;

heating the substrate at a temperature between 450° C. and 800° C.; and growing an oxide superconductor $YBa_2(Cu_zM_{1-z})_3O_{7-x}$ film in the same orientation as the substrate by a pulse laser deposition method, wherein:

M=Ni and z is at least 0.90 and less than 1, or

M=Co and z is at least 0.90 and less than 1, or

M=Zn and z is at least 0.95 and less than 1.

7. A method of producing an oxide superconductor film comprising the steps of:

providing a superconductor single crystal substrate consisting essentially of a superconductor material with an orientation containing a rare earth metal, an alkali earth metal and a copper metal; and growing the oxide superconductor film homoepitaxially on the substrate in the same orientation as the substrate, wherein the substrate is a single crystal of $LR_2M_3O_{7-x}$, where L=Y, La, Er, Eu, Gd, Dy, Sm or Ho; R=Ba, Sr or Mg; and wherein M is selected from the group consisting of Cu and Cu in combination with Ni, Co or Zn.

8. A method of producing an oxide superconductor film comprising the steps of:

providing a superconductor single crystal substrate consisting essentially of superconductor material with an orientation containing a rare earth metal, an alkali earth metal and a copper metal; and growing the oxide superconductor film of a material having a lattice structure which will be reduced to the substrate lattice by replacing constituent atoms heteroepitaxially on the substrate in the same orientation as the substrate, wherein the substrate is a single crystal of $LR_2M_3O_{7-x}$, where L=Y, La, Er, Eu, Gd, Dy, Sm or Ho; R=Ba, Sr or Mg; and wherein M is selected from the group consisting of Cu and Cu in combination with Ni, Co or Zn.

9. A method of producing an oxide superconductor film comprising the steps of:

providing a superconductor single crystal substrate consisting essentially of a superconductor material with an orientation containing a rare earth metal, an alkali earth metal and a copper metal; and growing the oxide superconductor film of a material having a lattice structure which will be reduced to the substrate lattice by replacing metal constituent atoms heteroepitaxially on the substrate in the same orientation as the substrate, wherein the superconductor film is a single crystal of $LR_2M_3O_{7-x}$, where L=Y, La, Er, Eu, Gd, Dy, Sm or Ho; R=Ba, Sr or Mg; and wherein M is selected from the group consisting of Cu and Cu in combination with Ni, Co or Zn.

10. A method according to any of the preceding claims, wherein the oxide superconductor film is free of non-superconductor material.

* * * * *